(12) United States Patent
Lipasti et al.

(10) Patent No.: US 6,600,789 B1
(45) Date of Patent: Jul. 29, 2003

(54) SIGNAL PROCESSING METHOD AND DEVICE

(75) Inventors: Lauri Lipasti, Helsinki (FI); Arhippa Kovanen, Helsinki (FI)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 09/319,232

(22) PCT Filed: Aug. 26, 1998

(86) PCT No.: PCT/US98/17743

§ 371 (c)(1),
(2), (4) Date: Jun. 2, 1999

(87) PCT Pub. No.: WO99/20004

PCT Pub. Date: Apr. 22, 1999

(30) Foreign Application Priority Data

Oct. 9, 1997 (FI) .................................................. 973919

(51) Int. Cl.[7] .............................................. H03M 3/02
(52) U.S. Cl. ...................................... 375/247; 341/143
(58) Field of Search ................................ 375/241, 242, 375/247, 316; 341/61, 143

(56) References Cited

U.S. PATENT DOCUMENTS

| | | | |
|---|---|---|---|
| 4,920,544 A | 4/1990 | Endo et al. .................... 375/26 |
| 5,055,843 A | * 10/1991 | Ferguson, Jr. et al. ....... 341/143 |
| 5,153,593 A | * 10/1992 | Walden et al. ............... 341/143 |
| 5,245,344 A | 9/1993 | Sooch .......................... 341/150 |
| 5,311,181 A | 5/1994 | Ferguson, Jr. et al. ....... 341/143 |
| 5,341,135 A | * 8/1994 | Pearce ......................... 341/120 |
| 5,392,042 A | * 2/1995 | Pellon .......................... 341/143 |
| 5,442,353 A | 8/1995 | Jackson ....................... 341/143 |
| 5,625,358 A | 4/1997 | Wilson et al. ............... 341/143 |
| 5,748,126 A | 5/1998 | Ma et al. ..................... 341/143 |
| 5,892,468 A | * 4/1999 | Wilson et al. ................. 341/61 |
| 5,949,361 A | * 9/1999 | Fischer et al. .............. 341/143 |
| 5,977,896 A | * 11/1999 | Kohdaka et al. ............ 341/143 |
| 6,104,329 A | * 8/2000 | Kawano ....................... 341/139 |
| 6,154,161 A | * 11/2000 | Leme et al. ................. 341/143 |
| 6,438,434 B1 | * 8/2002 | Kamiya ......................... 700/94 |

OTHER PUBLICATIONS

P.M. Aziz et al., "An Overview of Sigma–Delta Converters", IEEE Signal Processing Magazine, Jan. 1996, pp. 61–84.

B.P. Agrawal et al., "Design Methodology for Sigma–Delta Modulation", IEEE Transactions on Communications, vol. COM–31, Mar. 1983, pp. 360–370.

D.A. Johns et al., "Design and Analysis of Delta–Sigma Based IIR Filters", IEEE Transactions on Circuits and Systems–II: Analog and Digital Signal Processing, vol. 40, No. 4, pp. 233–240.

Book, Carley et al., "Delta–Sigma Data Converters—Theory, Design, and Simulation", IEEE Press, Chapter 8, pp. 244–281.

J.C. Candy et al., "Oversampling Delta–Sigma Data Converters: Theory, Design, and Simulation", IEEE Press, NY 1992, pp 1–25.

* cited by examiner

Primary Examiner—Young T. Tse
(74) Attorney, Agent, or Firm—Thomas Schneck

(57) ABSTRACT

The invention relates to digital signal processing and specifically to level control of a pulse density modulated (PDM) signal generated by a sigma-delta modulator. A single-bit pulse density modulated PDM signal is generated by a first sigma-delta modulator being an analog modulator, for instance. Level control is performed by multiplying the single-bit pulse density modulated PDM signal by a multibit multiplier to obtain a multibit number stream, which is reconverted into a single-bit PDM signal by a second digital sigma-delta modulator, as to the signal-to-noise ratio. Thus the most significant factor in the total signal-to-noise is the noise level of the first sigma-delta modulator, by which the PDM signal was originally generated. In the subsequent second sigma-delta modulator, the PDM signal can then be attenuated as much as is the difference between SNR performance of the modulators without any decrease in the total signal-to-noise ratio. A relative amplification of the PDM signal is provided in this manner.

20 Claims, 2 Drawing Sheets

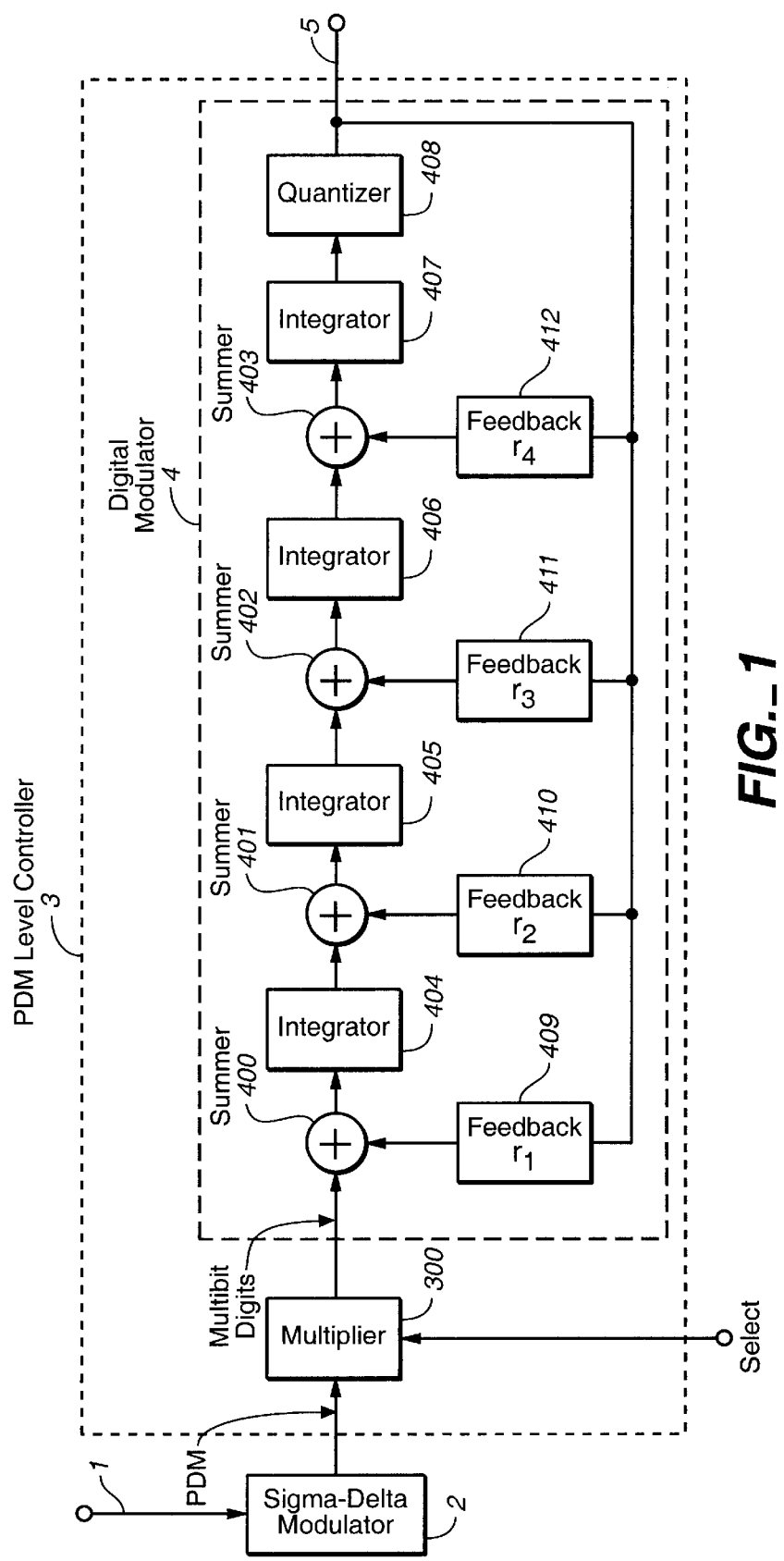
FIG._1

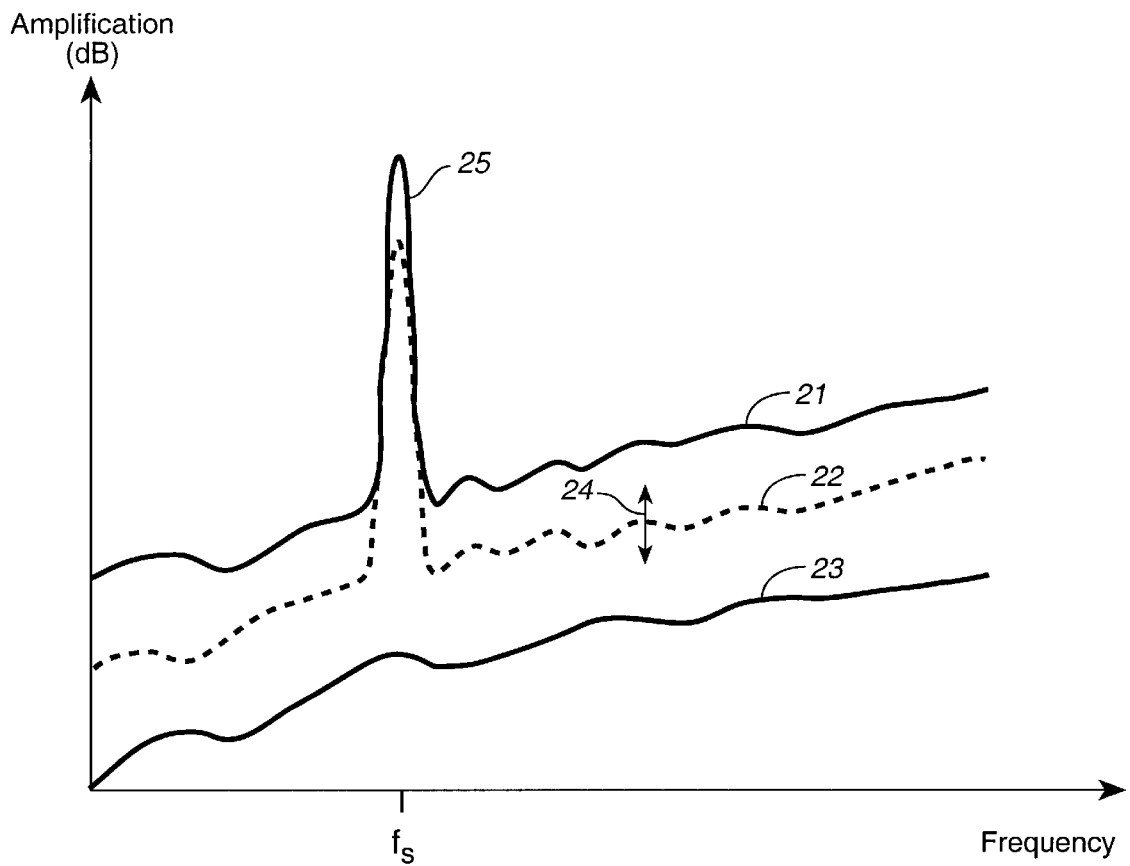
FIG._2
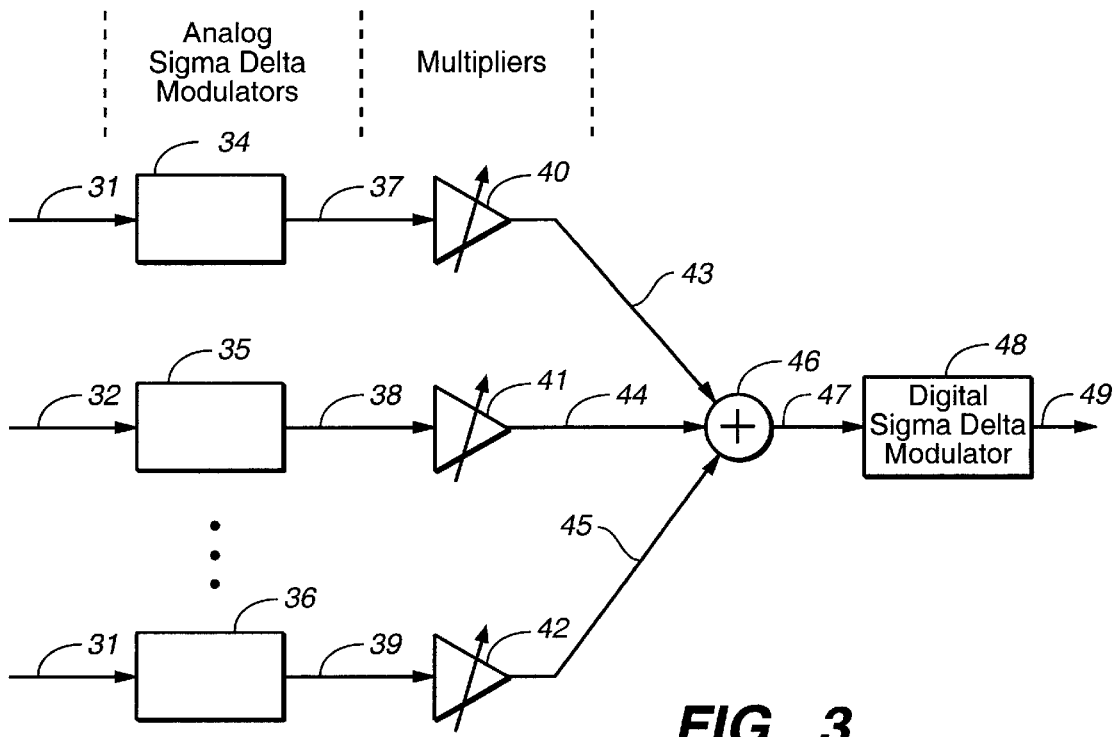
FIG._3

SIGNAL PROCESSING METHOD AND DEVICE

BACKGROUND OF THE INVENTION

The invention relates to digital signal processing and specifically to controlling the level of a pulse density modulation (PDM) signal generated by a sigma-delta modulator.

BACKGROUND OF THE INVENTION

The basic operations of signal processing, multiplication and addition, can be implemented in a known manner by analog signal processing blocks, or an analog signal can be converted into a digital one by using an A/D converter and the desired signal processing operations can be performed digitally. The results can be reconverted into analog signals by using a D/A converter. The A/D and D/A conversions are performed at predetermined sample frequency and at a predetermined resolution.

A/D and D/A convertors based on sigma-delta modulators have become very common recently. In a sigma-delta A/D convertor, a conversion of an analog signal into a baseband digital signal occurs at two stages. At the first stage, an input signal is converted by a sigma-delta modulator into an oversampled single-bit or multibit signal. At the second stage, this oversampled single-bit or multibit signal is decimated to the baseband by using digital filtering. Sigma-delta technique and converters are described for instance in the following articles:

[1] "An Overview of Sigma-Delta Converters", P. M. Aziz et al, IEEE Signal Processing Magazine, January 1996, pages 61 to 84.
[2] "Oversampling Delta-sigma Data Converters: Theory, Design and Simulation", J. C. Candy et al, IEEE Press NJ 1992, pages 1 to 25.
[3] "Design Methodology for Sigma-Delta Modulation". B. P. Agrawal et al, IEEE Transactions on Communications, Vol. COM-31, March 1983, pages 360 to 370.

An oversampled output signal of a sigma-delta modulator is a pulse density modulated (PDM) representation of an input signal. In sigma-delta A/D converters, the modulator converts an analog signal into a pulse density modulated (PDM) format. The PDM signal consists of an oversampled single-bit or multibit (e.g. 2 to 4 bits) signal. The relative pulse density of the PDM signal determine represents the amplitude of the input signal. In a frequency domain, the baseband part of the spectrum of the PDM signal is the useful signal band, and at higher frequencies of the spectrum, there is quantization noise produced by a noise processing function of the sigma-delta modulator. It has thus been possible to change the resolution at signal frequencies for over-sampling rate. As known, the noise processing performance of the sigma-delta modulator depends on the order of the modulator, and higher-order modulators remove quantization noise more efficiently from the signal band. By increasing the oversample ratio, the signal band can also be made narrower, in proportion, and the amount of the noise falling on the signal band smaller. Moreover, the amount of noise in the signal band in a sigma-delta modulator can be controlled by the transfer function of the modulator, e.g. by inserting zeroes at suitable frequencies in the transfer function of the modulator.

Solutions for implementing a limited number of signal processing operations by using PDM signals have been presented in the literature lately. The known advantages of digital signal processing are then achieved, such as accuracy, repeatability, unsensitivity to interference, and so on. When a signal is processed directly in an oversampled PDM format, it needs not be converted into a pulse code modulated (PCM) signal at the Nyquist frequency for signal processing. Decimation and interpolation filters generating a baseband PCM signal from a PDM signal can then be omitted in signal processing points. This is a remarkable advantage, because a circuit implementation of a sigma-delta modulator generating the PDM signal is usually small in size and simple, while the decimation and interpolation filter often is a big and complex circuit structure requiring much circuit surface in an integrated circuit implementation and therefore causing additional costs. For instance, the article [4], "Design and Analysis of Delta-Sigma Based IIR Filters", D. A. John et al, IEEE Transactions on Circuits and Systems-II: Analog and Digital Signal Processing. Vol. 40, NO. 4, pages 233 to 240, describes an A/D converter having many inputs, each input being filtered separately and summed together before a common decimation filter. An audio mixing board, for instance, can be implemented in this way.

An important form of signal processing is control of signal level: amplification and/or attenuation. This property is very usable especially for audio applications, such as the above-mentioned audio mixing board. Accordingly, it would be preferable, if a PDM signal level also could be controlled. FIG. 1 of the above article [4] shows a sigma-delta attenuator, in which an oversampled 1-bit signal (PDM) is multiplied by a multibit coefficient al and the resulting multibit signal is applied to a digital sigma-delta modulator outputting a 1-bit PDM signal. The multiplier of the 1-bit PDM signal is implemented as a 2-input multiplexor (selector) selecting al or −al as an output according to the state of the incoming PDM signal. The article also describes a digital sigma-delta filter suitable for this purpose. The attenuator is possible to implement when said multibit coefficient is lower than one. The feedback value of the sigma-delta modulator being b and said coefficient being a, an attenuation ratio a/b is obtained.

A problem with this known solution is that only an attenuation of a PDM signal has been possible, and therefore, it has been necessary to perform all multiplications by coefficients lower than one. An amplification of a PDM signal has not been considered possible, because the input value of the modulator cannot exceed or even come near the feedback value of the modulator due to the structure of the sigma-delta modulator. The sigma-delta modulator is a conditionally stable structure and the output signals of integrators escape upon the input exceeding a predetermined value. In an analog sigma-delta modulator, the input value is allowed to be normally, depending on the order and the structure of the modulator, approximately 0.3 to 0.7 times the feedback value, cf. article [3]. An amplification of the PDM signal in such a circuit would require an ingoing signal to be multiplied by a number higher than the feedback value. Even if the input level of an A/D modulator were very low and it could, in principle, be amplified quite much by setting the input signal values (a) higher than the feedback value (b), the resulting PDM signal would have only +1 and −1 values (single-bit case). By multiplying, the modulator would momentarily obtain too high values. The density and energy of the PDM signal would still be low on an average, but instantaneous values would make the modulator quickly unstable.

BRIEF DESCRIPTION OF THE INVENTION

An object of the invention is a signal processing method and device, enabling also a relative amplification of a PDM signal, without the noise level increasing remarkably.

The objects of the invention are achieved by a signal processing method comprising the steps of generating an N-bit pulse density modulated signal by a first sigma-delta modulator, where N=1, 2, . . . ; controlling the level of the pulse density modulated signal a) by multiplying the N-bit pulse density modulated signal by a multibit multiplier, the output of which is an M-bit signal, where M>N, b) by converting the M-bit signal into an N-but pulse density modulated signal by a digital sigma-delta modulator. The method is according to the invention characterized in that the M-bit signal is converted into the N-bit pulse density modulated signal by the digital sigma-delta modulator having a better signal-to-noise ratio performance than said first sigma-delta modulator.

Another object of the invention is a signal processing system comprising a first sigma-delta modulator generating an N-bit pulse density modulated signal, where N=1, 2, . . . ; means for controlling the level of the pulse density modulated signal, the means comprising a) a multibit multiplier, the input of which is the N-bit pulse density modulated signal and the output an M-bit signal, where M>N, b) a digital sigma-delta modulator converting the M-bit signal into the N-bit pulse density modulated signal. The system is according to the invention characterized in that said digital sigma-delta modulator has a better signal-to-noise ratio performance than said first sigma-delta modulator.

A single-bit pulse density modulated PDM signal is generated by the first sigma-delta modulator being an analog modulator, for instance. The level control is performed by multiplying the single-bit PDM signal by a multibit coefficient, so that a multibit stream of numbers is obtained. The number stream is reconverted into a single-bit PDM signal by a second sigma-delta modulator, preferably being a digital modulator.

In accordance with the basic idea of the invention, the signal-to-noise ratio performance of said second sigma-delta modulator, by which the multibit stream of numbers is reconverted into a PDM signal, is better than that of said first sigma-delta modulator. Accordingly, the most significant factor of the total signal-to-noise ratio (SNR) is the noise level of the first sigma-delta modulator, by which the PDM signal originally was generated. In said subsequent second sigma-delta modulator, the PDM signal can be attenuated within a range which is equal to the difference between the SNR performances of the modulators, without any decrease in the total signal-to-noise ratio. For instance, if the SNR of the first sigma-delta modulator is 90 dB at maximum excitation and the SNR of the second sigma-delta modulator is 110 dB, the PDM signal can be attenuated in the second modulator by nearly 20 dB without any decrease in the signal-to-noise ratio. This is possible, because, in the latter modulator, besides the signal, naturally also the noise of the first modulator on the signal band is attenuated and approaches the noise floor set by the second modulator structure.

The PDM signal has thus been scaled to a slightly lower level without any decrease in the performance. Though the second sigma-delta modulator also attenuates the signal, the attenuation may be less than said difference between the performances (20 dB in the above example), whereby a relative amplification is achieved. When the PDM signal is attenuated less than said difference between the SNR performances of the two modulators, the same total signal-to-noise ratio is obtained as by the preceding analog modulator. In the example case, the nominal level of the signal can be fixed to a point where the first modulator gives an unattenuated signal and the second modulator attenuates the signal by 20 dB. The second-order attenuation may be C. In the example case, the total signal-to-noise ratio will then be 90 dB, the signal being between +20–0 dB and 90+20–(c), c being between 20 and 110 dB, and the attenuation of the system thus between 0 and 90 dB.

BRIEF DESCRIPTION OF THE DRAWINGS

The invention will now be described in more detail by way of preferred embodiments, with reference to the attached drawings, in which FIG. 1 is a block diagram illustrating a PDM level controller according to the invention, connected after an analog sigma-delta A/D modulator;

FIG. 2 is a graph showing noise and signal levels of an analog sigma-delta modulator and a digital sigma-delta modulator and a controlling area at disposal as a function of frequency;

FIG. 3 is a block diagram showing a multi- channel PDM level controller.

DETAILED DESCRIPTION OF THE INVENTION

With reference to FIG. 1, an analog sigma-delta modulator 2 performs an A/D conversion of an analog input signal at an input 1 into a 1-bit pulse density modulated (PDM) format. The modulator 2 may be, for instance, any sigma-delta A/D modulator structure described in the article [1]. Let us assume that the modulator 2 is a third-order sigma-delta modulator having a signal-to-noise ratio of about 100 dB. A single-bit PDM signal, which may obtain the values +1 and −1, is applied to a PDM level controller 3.

The PDM level controller 3 according to a preferred embodiment of the invention comprises a digital modulator 4 and a preceding multiplier 300. Level control is performed by multiplying the single-bit pulse density modulated (PDM) signal by a multibit coefficient a in the multiplier 300 in order to obtain a multibit number stream, which is reconverted into a single-bit PDM signal by means of a digital sigma-delta modulator 4.

In the case of single-bit PDM signal, the multiplier 300 can be implemented by a simple multiplexor or selector, generating an output +a or −a depending on whether the input value is +1 or −1. The output of the multiplier 300 is thus a multibit number stream consisting of the numbers +a and −a. The multiplier 300 may have a structure similar to the one disclosed in the article [4]. The multiplier may have one fixed coefficient or the value of the coefficient may be adjustable. In the preferred embodiment of the invention shown in FIG. 1, a selection signal SELECT may choose one of several coefficients a1 . . . an, and accordingly, a desired attenuation or amplification can be set. The coefficients may be in accordance with Table 1, for instance. The Table indicates 32 values of the coefficient a, giving a level control range of +12 dB . . . −34.5 dB by 1.5 dB steps.

TABLE 1

| Coefficient a | Amplification (dB) |
| --- | --- |
| 872 | +12.0 |
| 734 | 10.5 |
| 617 | 9.0 |
| 519 | 7.5 |
| 437 | 6.0 |
| 368 | 4.5 |
| 309 | 3.0 |

TABLE 1-continued

| Coefficient a | Amplification (dB) |
| --- | --- |
| 260 | 1.5 |
| 219 | 0 |
| 184 | −1.5 |
| 155 | −3.0 |
| 130 | −4.5 |
| 110 | −6.0 |
| 92 | −7.5 |
| 78 | −9.0 |
| 65 | −10.5 |
| 55 | −12.0 |
| 46 | −13.5 |
| 39 | −15.0 |
| 33 | −16.5 |
| 28 | −18.0 |
| 23 | −19.5 |
| 20 | −21.0 |
| 16 | −22.5 |
| 14 | −24.0 |
| 12 | −25.5 |
| 10 | −27.0 |
| 8 | −28.5 |
| 7 | −30.0 |
| 6 | −31.5 |
| 5 | −33.0 |
| 4 | −34.5 |

The digital modulator 4 is a fourth-order modulator, comprising summers 400 to 403, integrators 404 to 407, a quantizer 408 and feedbacks 409 to 412, having the feedback coefficients r1 to r4, respectively. It is to be noted that a detailed implementation and structure of the modulator 4 is of no significance for the invention. Only the fact that the performance of the modulator 4 is better than that of the modulator 2 is of significance for the invention, as will be described below. The input of the modulator 4 is said number stream consisting of the numbers +a and −a. The output 5 of the modulator 4 is a 1-bit oversampled PDM signal. The level of the PDM signal is controlled in the level controller 3 at the ratio a/r1. On account of the unstable nature of the sigma-delta modulator, the input value of the modulator 4 cannot approach the internal reference voltage value of the modulator, which means that the coefficient a shall be lower than the feedback coefficient r1. Therefore, the PDM signal can only be attenuated in the multiplier 300.

At the system level, i.e. between the input 1 and the output 5, amplification can be provided, however, when the performance of the digital sigma-delta modulator is higher than that of the modulator 2, as to the noise processing performance. The noise processing performance of the modulator 4 may be higher thanks to higher order, multibit quantization and feedback or higher oversampling ratio, or some combination of these, for instance. In the embodiment of FIG. 1, the modulator 4 is a fourth-order modulator, while the modulator 2 is a third-order modulator. When a higher-order modulator (or a modulator having otherwise a better noise processing performance) follows a lower-order modulator on the processing path of the PDM signal, the noise level of the lower-level modulator is most decisive for the total signal-to-noise ratio (SNR) of the system. In the case of FIG. 1, the signal-to-noise ratio at the output 5 is thus primarily determined on the basis of the signal-to-noise ratio of the modulator 2. The performance of the modulator 4 shall be at least a desired need of amplification and preferably also a suitable stability margin better than the signal-to-noise ratio of the modulator 2 and the incoming PDM signal. Because the signal-to-noise ratio of the modulator 4 of the level controller 3 is considerably better than that of the incoming PDM signal, the level controller may lower the level of the whole PDM signal without practically any decrease in the signal-to-noise ratio at all. This is possible, because in addition to the noise of a payload signal, also the noise of the PDM signal is attenuated. The signal has thus been scaled to a slightly lower level without any decrease in the performance. Though the PDM signal is attenuated also in the modulator 4, it is possible to attenuate the signal in the level controller 3 less than said difference between the performances of the modulators 2 and 4 and to achieve a relative amplification.

Let us examine the operation of the level controller according to the invention by way of example with reference to the graph of FIG. 2. Assuming that the analog modulator 2 is a third-order modulator, the signal-to-noise ratio of which is about 100 dB. The modulator 4 is a fourth-order digital modulator, the signal-to-noise ratio of which is about 120 dB, i.e. about 20 dB better than that of the modulator 2. The desired control range is +12 dB . . . −34.5 dB by 1.5 dB steps. To ensure the stability of the modulator 4, the ratio a/r1 is 0.5, i.e. −6 dB. The value of the reference r1 can be calculated as a function of the maximum attenuation (−34.5 dB) and the required accuracy (<0.3 dB). Accordingly, the reference value is assumed to be 1744. The amplification +12 dB is now corresponded to by multiplying the incoming PDM signal by 872 and the maximum attenuation is correspond to by multiplying the PDM signal by 4. In the above Table 1, all different values of the coefficient a are listed, and so are the corresponding amplifications, when the value of the reference r1 is the constant 1744. The different between the performances of the modulators 2 and 4 being 20 dB and the stability margin being set to 6 dB, the range of amplification at disposal is about 14 dB.

In the present example, the signal-to-noise ratio remains approximately the same in the range +12 . . . −1.5 dB as it is after the modulator 2. At higher attenuation, the noise of the very input signal is attenuated below a noise floor 22 of the modulator 4, the attenuated payload signal 25 and the noise floor 22 determining the signal-to-noise ratio at the output 5.

The invention is described above in conjunction with a 1-bit PDM signal. The invention can, however, be applied directly to a multibit, e.g. 2-bit to 4-bit, PDM signal as well.

The preferred embodiment of the invention described in FIG. 1 shows the analog modulator 2, the multiplier 300 and the digital modulator 4 sequentially connected. In practice, these units may be located apart from each other in the signal processing system in such a way that there are other signal processing stages between them. An example of such a signal processing system is shown in FIG. 3.

FIG. 3 shows three analog input signals 31, 32 and 33, which are applied to respective analog sigma-delta Modulators 34, 35 and 36. The modulators 34, 35 and 36 generate PDM signals 37, 38 and 39, respectively, which are applied to multipliers 40, 41 and 42, respectively. The multipliers 40, 41 and 42 generate multibit number streams 43, 44 and 45, respectively, which are summed in a summer 46 to a multibit number stream 47. The signal 47 is converted into a PDM signal 49 by a digital sigma-delta modulator 48. The modulators 34 to 36 may have a structure similar to that of the modulator 2 in FIG. 1. The structure of the multipliers 40 to 42 may be similar to that of the multiplier 300 in FIG. 1. The modulator 48 may have a structure similar to that of the modulator 4 in FIG. 1. An application of the signal processing apparatus of the type shown in FIG. 3 is an audio mixing board.

The invention can be applied to the level control of a PDM signal in all sigma-delta structures. Typical objects of application are, besides audio applications, also IIR and FIR filter structures.

It is obvious to one skilled in the art that, with the technique developing, the basic idea of the invention can be implemented in many different ways. Accordingly, the invention and its embodiments are not restricted to the above examples, but they may vary within the scope of the claims.

What is claimed is:

1. A signal processing method comprising the steps of:
   generating an N-bit pulse density modulated signal by a first sigma-delta modulator, where N=1,2, . . . ;
   controlling the level of the pulse density modulated signal;
   a) by multiplying the N-bit pulse density modulated signal by a multibit multiplier, the output of which is an M-bit signal, where M>N;
   b) by converting the M-bit signal into an N-bit over-sampled pulse density modulated signal by a digital sigma-delta modulator characterized in that;
   the M-bit signal is converted into the N-bit over-sampled pulse density modulated signal by the digital sigma-delta modulator having a better signal-to-noise ratio performance than said first sigma-delta modulator.

2. A method according to claim 1, characterized in that the level control step additionally comprises the step of:
   providing a relative amplification of the N-bit over-sampled pulse density modulated signal by multiplying said N-bit over-sampled pulse density modulated signal by a coefficient corresponding to an attenuation less than a difference between the signal-to-noise ratio performance of the first sigma-delta modulator and the digital sigma-delta modulator.

3. A method according to claim 1, characterized in that the digital sigma-delta modulator is used, a noise processing performance of which is better than that of the first sigma-delta modulator due to the following factors: higher order, multibit quantization, multibit feedback, and higher over-sampling ratio.

4. A signal processing system comprising:
   a first sigma-delta modulator (2) generating an N-bit pulse density modulated signal, where N=1, 2, . . . ;
   means (3) for controlling the level of the pulse density modulated signal, the means comprising
   a) a multibit multiplier (300), the input of which is the N-bit pulse density modulated signal and the output is an M-bit signal, where M>N,
   b) a digital sigma-delta modulator (4) converting the M-bit signal into an N-bit over-sampled pulse density modulated signal, characterized in that,
   said digital sigma-delta modulator (4) has a better signal-to-noise ratio performance than said first sigma-delta modulator (2).

5. A system according to claim 4, characterized in that the level controlling means (3) has a relative amplification, when the coefficient of the multibit multiplier (300) corresponds to an attenuation lower than a difference between the signal-to-noise ratio performance of the first sigma delta modulator and the digital sigma delta modulator.

6. A system according to claim 4, characterized in that the noise processing performance of said digital sigma-delta modulator (4) is better than that of the first sigma-delta modulator (2) due to the following factors: higher order, multibit quantization, mutibit feedback, and higher over-sampling ratio.

7. A system according to claim 4, characterized in that the first sigma-delta modulator (2) is an analog sigma-delta modulator.

8. A system according to claim 4, characterized in that the system is part of a digital filter of pulse density modulated signals, such as an IIR or a FIR filter.

9. A system according to claim 4, characterized in that the system is an audio mixing board that forms an integral part of an audio system.

10. A system according to claim 4, characterized in that the coefficient value of the multiplier (300) is stepwise adjustable.

11. A signal processing method comprising the steps of:
    generating a single-bit pulse density modulated signal by a first sigma-delta modulator;
    controlling the level of the pulse density modulated signal;
    a) by multiplying the single-bit pulse density modulated signal by a multibit multiplier, the output of which is an M-bit signal;
    b) by converting the M-bit signal into a single-bit over-sampled pulse density modulated signal by a digital sigma-delta modulator characterized in that;
    the M-bit signal is converted into the single-bit over-sampled pulse density modulated signal by the digital sigma-delta modulator having a better signal-to-noise ratio performance than said first sigma-delta modulator.

12. A method according to claim 11, characterized in that the level control step additionally comprises the step of:
    providing a relative amplification of the single-bit over-sampled pulse density modulated signal by multiplying said single-bit over-sampled pulse density modulated signal by a coefficient corresponding to an attenuation less than a difference between the signal-to-noise ratio performance of the first sigma-delta modulator and the digital sigma-delta modulator.

13. A method according to claim 11, characterized in that the digital sigma-delta modulator is used, a noise processing performance of which is better than that of the first sigma-delta modulator due to the following factors: higher order, multibit quantization, multibit feedback, and higher over-sampling ratio.

14. A signal processing system comprising:
    a first sigma-delta modulator (2) generating a single-bit pulse density modulated signal;
    means (3) for controlling the level of the pulse density modulated signal, the means comprising:
    a) a multibit multiplier (300), the input of which is the single-bit pulse density modulated signal and the output is an M-bit signal;
    b) a digital sigma-delta modulator (4) converting the M-bit signal into a single-bit over-sampled pulse density modulated signal, characterized in that;
    said digital sigma-delta modulator (4) has a better signal-to-noise ratio performance than said first sigma-delta modulator (2).

15. A system according to claim 14, characterized in that the level controlling means (3) has a relative amplification, when the coefficient of the multibit multiplier (300) corresponds to an attenuation lower than a difference between the signal-to-noise ratio performance of the first sigma delta modulator and the digital sigma delta modulator.

16. A system according to claim 14, characterized in that the noise processing performance of said digital sigma-delta modulator (4) is better than that of the first sigma-delta modulator (2) due to the following factors: higher order, multibit quantization, multibit feedback, and higher oversampling ratio.

17. A system according to claim 14, characterized in that the first sigma-delta modulator (2) is an analog sigma-delta modulator.

18. A system according to claim 14, characterized in that the system is part of a digital filter of pulse density modulated signals, such as an IIR or a FIR filter.

19. A system according to claim 14, characterized in that the system is an audio mixing board that forms an integral part of an audio system.

20. A system according to claim 14, characterized in that the coefficient value of the multiplier (300) is stepwise adjustable.

* * * * *